US009264059B2

(12) United States Patent
Tousi et al.

(10) Patent No.: US 9,264,059 B2
(45) Date of Patent: Feb. 16, 2016

(54) CALIBRATION OF TIME-INTERLEAVED ANALOG-TO-DIGITAL CONVERTER

(71) Applicant: SITUNE CORPORATION, San Jose, CA (US)

(72) Inventors: Yahya Tousi, San Jose, CA (US); Vahid Mesgarpour Toosi, Los Altos, CA (US)

(73) Assignee: SITUNE CORPORATION, San Jose, CA (US)

( * ) Notice: Subject to any disclaimer, the term of this patent is extended or adjusted under 35 U.S.C. 154(b) by 0 days.

(21) Appl. No.: 14/290,695

(22) Filed: May 29, 2014

(65) Prior Publication Data

US 2015/0326240 A1    Nov. 12, 2015

Related U.S. Application Data

(63) Continuation-in-part of application No. 14/273,440, filed on May 8, 2014.

(51) Int. Cl.
| | |
|---|---|
| *H03M 1/06* | (2006.01) |
| *H03M 1/18* | (2006.01) |
| *H03M 1/46* | (2006.01) |

(52) U.S. Cl.
CPC ............. *H03M 1/183* (2013.01); *H03M 1/46* (2013.01)

(58) Field of Classification Search
CPC .......... H03M 1/06; H03M 1/10; H03M 1/12; H03M 1/16; H03M 1/18; H03M 1/1009; H03M 1/1057; H03M 1/1215; H03M 1/1052; H03M 1/1042; H03M 1/0624; H03M 1/0626; H03M 1/46
USPC .......................... 341/118–120, 122–123, 155
See application file for complete search history.

(56) References Cited

U.S. PATENT DOCUMENTS

| | | | |
|---|---|---|---|
| 5,294,926 A * | 3/1994 | Corcoran ...................... 341/120 |
| 6,384,757 B1 | 5/2002 | Kosonen |
| 7,535,390 B2 * | 5/2009 | Hsu ............................... 341/118 |
| 7,834,786 B2 * | 11/2010 | Kawahito et al. ............. 341/120 |
| 8,335,979 B2 | 12/2012 | Pisek et al. |
| 8,344,919 B2 | 1/2013 | Tseng |
| 8,368,571 B2 | 2/2013 | Siragusa |
| 8,487,795 B1 * | 7/2013 | Jiang et al. .................... 341/122 |
| 8,604,954 B2 * | 12/2013 | Chen et al. .................... 341/120 |
| 8,654,000 B2 * | 2/2014 | Waltari ......................... 341/166 |
| 8,917,125 B1 * | 12/2014 | Waltari ......................... 327/147 |

(Continued)

OTHER PUBLICATIONS

Non-Final Office Action for U.S. Appl. No. 14/273,440 mailed May 12, 2015.

*Primary Examiner* — Lam T Mai
(74) *Attorney, Agent, or Firm* — Novak Druce Connolly Bove + Quigg LLP (57) ABSTRACT

Various embodiments describe systems and methods for calibrating gain mismatches and timing errors in and between individual ADC channels of a time-interleaved ADC. In some embodiments, a calibration signal (e.g., a DC signal) can be selectively applied to each ADC channel of a time-interleaved ADC to estimate a gain mismatch of the corresponding ADC channel. The gain mismatch can then be compensated by a gain correction circuit at the digital backend of the time-interleaved ADC. In some embodiments, timing errors between ADC channels of a time-interleaved ADC can be measured by applying a time varying signal to the ADC channels of the time-interleaved ADC. The timing errors can be calibrated by applying a feedback signal to a clock phase generator of the time-interleaved ADC.

20 Claims, 7 Drawing Sheets

(56) References Cited

U.S. PATENT DOCUMENTS

| | | | |
|---|---|---|---|
| 9,030,340 B1* | 5/2015 | Waltari | 341/118 |
| 2005/0219091 A1* | 10/2005 | Wood et al. | 341/120 |
| 2005/0225470 A1 | 10/2005 | Tsai et al. | |
| 2005/0278611 A1 | 12/2005 | Park et al. | |
| 2008/0174461 A1* | 7/2008 | Hsu | 341/118 |
| 2010/0306208 A1 | 12/2010 | Haselden et al. | |

* cited by examiner

CALIBRATION OF TIME-INTERLEAVED ANALOG-TO-DIGITAL CONVERTER

CROSS REFERENCE TO RELATED APPLICATION

This application is a continuation-in-part of U.S. patent application Ser. No. 14/273,440, filed May 8, 2014, all of which is expressly incorporated herein by references in its entireties.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of communications, and more specifically to telecommunication receivers.

BACKGROUND

With high bandwidth applications (e.g., full band cable and satellite receivers, serial links and short range wireless communications) becoming more and more popular, there is increasing demand for high speed and high performance analog-to-digital convertors (ADCs). An effective way to improve the throughput of an ADC is to place several ADCs that operate at a fraction of the total sample rate of the ADC in a time-interleaved architecture. However, it's a challenge to control and compensate mismatch (e.g., offset, gain, and timing) of the channel ADCs with the time-interleaved architecture.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Systems and methods in accordance with various embodiments of the present disclosure may overcome one or more of the foregoing or other deficiencies experienced in conventional approaches for wireless and/or wired communication. In particular, various embodiments describe systems and methods for calibrating gain mismatches and timing errors in and between individual ADC channels of a time-interleaved ADC. In some embodiments, a calibration signal (e.g., a DC signal) can be selectively applied to each ADC channel of a time-interleaved ADC to estimate a gain mismatch of the corresponding ADC channel. The gain mismatch can then be compensated by a gain correction circuit at the digital back-end of the time-interleaved ADC. In some embodiments, timing errors between ADC channels of a time-interleaved ADC can be measured by applying a time varying signal to the ADC channels of the time-interleaved ADC. The timing errors can be calibrated by applying a feedback signal to a clock phase generator of the time-interleaved ADC. In some embodiments, a backend filter can be used at the end of digital blocks of the time-interleaved ADC to substantially compensate residual timing errors in and between ADC channels of the time-interleaved ADC. In many instances, a feedback signal can be generated for a particular ADC channel of the time-interleaved ADC based at least upon gain matches or timing errors of the corresponding ADC channel. Therefore, an area-efficient and power-efficient design can be achieved in a time-interleaved architecture.

Various embodiments apply to wideband applications. These applications include, but are not limited to, cable and satellite full band receivers, wireline and wireless communication, imaging and video, signal surveillance, electronic warfare, test equipment, transmitters, and radar and data communications. Some applications, processes, and uses are presented below with respect to the various embodiments.

Figure 1:
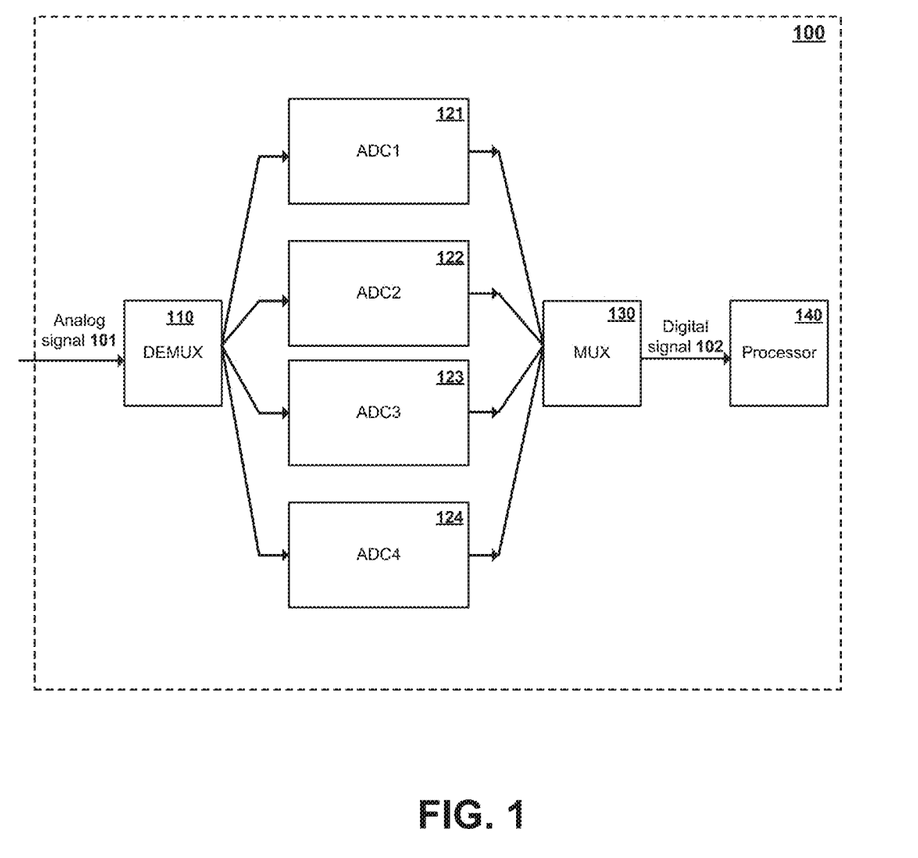
FIG. 1 illustrates an example analog-to-digital convertor (ADC) with a time-interleaved architecture in accordance with various embodiments.

FIG. 1 illustrates an example analog-to-digital convertor (ADC) 100 with a time-interleaved architecture in accordance with various embodiments. In this example, an analog input signal 101 is demultiplexed in the analog domain to M (e.g., M=4) distinct ADC channels, ADC1 121, ADC2 122, ADC3 123 and ADC4 124. M can be a natural number equal or greater than two. Each ADC channel can be implemented using a FLASH ADC or a pipeline ADC. For example, a FLASH ADC can comprise a group of $2^N-1$ comparators that sample an input signal at the same time and concurrently process the signal to yield an N-bit output signal. The FLASH ADC is suitable for high speed applications. A pipeline ADC, however, breaks up N-bit conversion into multiple one or more bits operations that are carried out sequentially in a plurality of pipeline stages. The pipeline ADC can be suitable for high-precision applications.

The M ADC channels in the ADC 100 operate time-interleaved. In a time-interleaved architecture, each distinct ADC channel is configured to run with clocks that are offset in phase by 360/M degrees. If the high speed ADC 100 has a conversion rate of $f_s$, each distinct channel samples operates at a rate of $f_s/M$. For example, assuming that each ADC channel runs at a speed of 4/M GHZ, the overall sampling rate of the high speed ADC 100 is thus configured to run at a speed of 4 GHZ. The output bits of the M distinct channels can be multiplexed by a Multiplex (MUX) 130 with suitable digital corrections and gain corrections. At least one processor 140 receives the digital signal 102 from the MUX 130 for data processing. Although only one processor is shown in FIG. 1, one or more various types of electronic or computing devices that are capable of processing data may be used. The processor may use operating systems that include, but are not limited to, Android, Berkeley Software Distribution (BSD), iPhone OS (iOS), Linus, OS X, Unix-like Real-time Operating System (e.g., QNX), Microsoft Windows, Window Phone, and IBM z/OS.

In some embodiments, the ADC 100 may also include one or more memory devices for storing instructions and data. As would be apparent to one of ordinary skill in the art, the one or more memory devices can include many types of memory, data storage, or computer-readable media, such as a data storage for program instructions for execution by the at least one processor 130 and/or being used for storing data, a removable memory available for sharing information with other devices, and any number of computing approaches available for sharing with other processors. The example ADC 100 may also include power components, such as conventional plug-in approaches, a battery operable to be recharged through conventional plug-in approaches, or through other approaches such as wireless (e.g., capacitive or inductive) charging through proximity with a power mat or other such device. Various other elements and/or combinations are possible as well within the scope of various embodiments.

Figure 2:
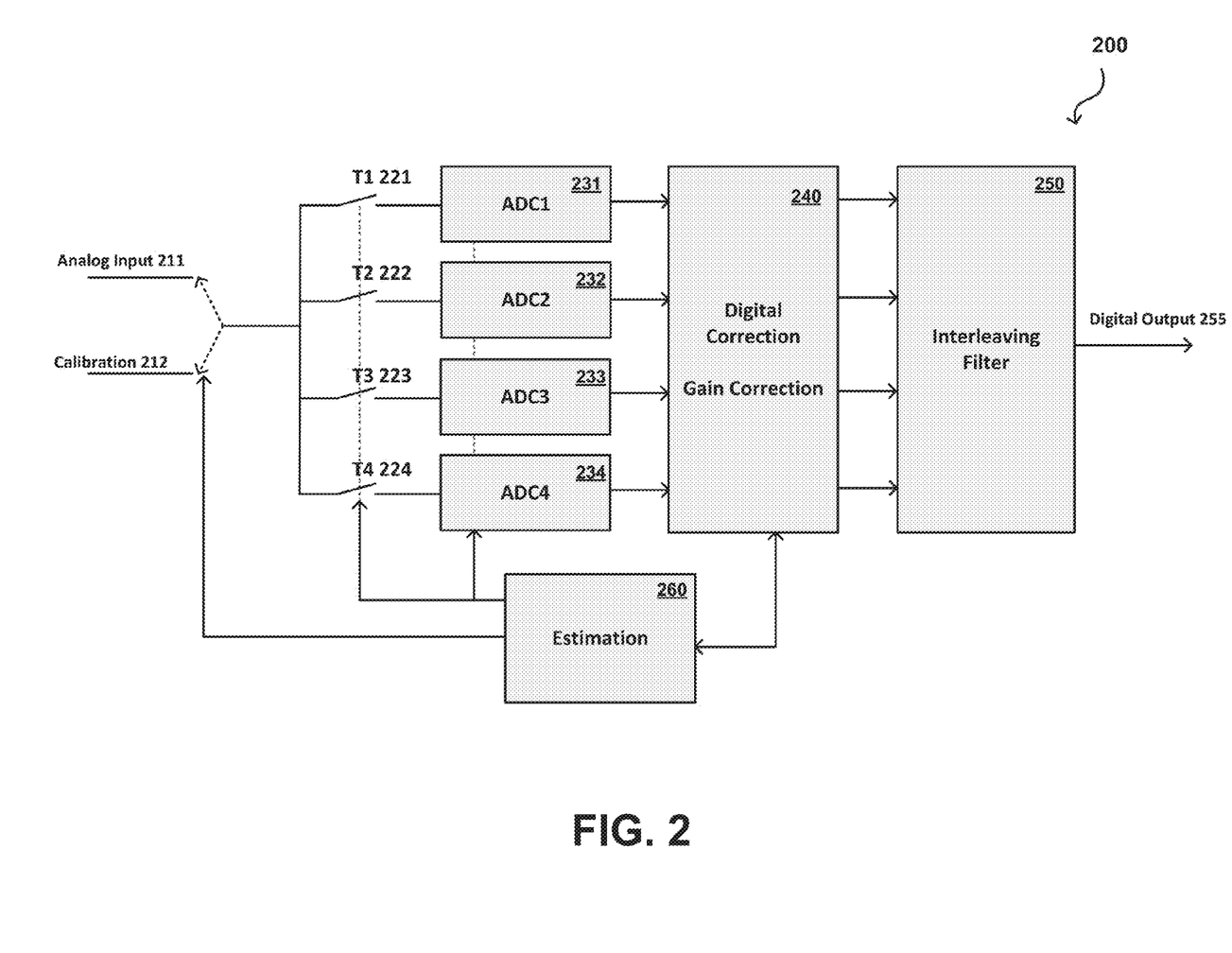
FIG. 2 illustrates a calibration scheme in a time-interleaved ADC in accordance with various embodiments.

FIG. 2 illustrates a calibration scheme in a time-interleaved ADC 200 in accordance with various embodiments. In this example, the time-interleaved ADC 200 has M (e.g., M=4) ADC channels, ADC1 231, ADC2 232, ADC3 233 and ADC4 234. Assuming the time-interleaved ADC 200 samples an input signal with a frequency of $f_s$, each ADC channel can sample an input signal at a rate of $f_s/M$ causing the input spectrum in a frequency domain to be repeated periodically at intervals of $f_s/M$. If the M ADC channels are perfectly matched, the periodic repetition cancel each other, except at integer multiple of $f_s$. However, channel mismatches between the M ADC channels are inherent in a circuit. The downscaling of an integrated circuit even complicates the matching of components in the M ADC channels. The error behavior of mismatches among the M ADC channels can distort the output signal of the time-interleaved ADC 200 and reduce the system performance significantly.

In accordance with various embodiments, there may be two types of mismatches in the time-interleaved ADC 200. The first type of matches is due to, for example, mismatch between gain coefficients of the M ADC channels. The gain mismatches are deviations of the gains $g_m$ from the average gain of all ADC channels. In this example, a calibration signal (e.g., a DC signal) 212 can be applied to M independent switches (e.g., M=4), T1 221, T2 222, T3 223 and T4 224, which are connected to the ADC channels, ADC1 231, ADC2 232, ADC3 233 and ADC4 234, respectively. Each of the M independent switches can be opened or closed separately. By closing a particular switch and opening the other switches, the gain $g_m$ of the corresponding ADC channel can be calculated based on an output signal of the corresponding ADC channel and the calibration signal 212. For example, an output signal of the time-interleaved ADC 200 can be measured by closing the switch T1 221 and opening the switches T2 222, T3 223 and T4 224. The gain $g_{m1}$ of the ADC channel ADC1 231 can be calculated based on the output signal of the ADC channel ADC1 231 and the calibration signal 212. Similarly, the gains $g_{m2}$, $g_{m3}$, and $g_{m4}$ of the ADC channels ADC2 232, ADC3 233 and ADC4 234, respectively, can be calculated. Thus, the deviation of a particular ADC channel's gain from the average gain of all channels can be determined. The deviation of the particular ADC channel's gain can be compensated by a gain correction circuit 240 that is coupled to digital outputs of the ADC channels. In some embodiments, a gain deviation of a particular ADC channel can be compensated by adding one adder and one multiplier to the digital signal path of the particular ADC channel.

In various embodiments, a gain of each ADC channels is determined by an estimation circuit 260 that is coupled to the calibration signal 212, the switches T1 221, T2 222, T3 223 and T4 224, the ADC channels ADC1 231, ADC2 232, ADC3 233 and ADC4 234, and the gain correction circuit 240. The estimation circuit 260 is also configured to determine the gain mismatch of each ADC channels. The determined gain mismatch can be communicated to the gain correction circuit 240 for compensation. In some embodiments, the estimation circuit 260 is configured to select either an analog signal 211 or a calibration signal 212) to connect to the time-interleaved ADC 200, and control the switches T1 221, T2 222, T3 223 and T4 224, the ADC channels ADC1 231, ADC2 232, ADC3 233 and ADC4 234, and/or the gain correction circuit 240.

The second type of matches can be, for example, sampling errors of ADC channels of the time-interleaved ADC 200. In some embodiments, the sampling errors are due to timing mismatches between the ADC channels and are the deviations from linear-phase responses of the M ADC channels normalized by the frequency. For example, if we split the phase responses into a linear and a non-linear part, $\phi_m(\Omega)=t_m(\Omega)+\Phi_m(\Omega)$, where $t_m(\Omega)$ is the linear-phase response over the frequency band of interest. The sample errors may be due to the deviation from the averaged and frequency normalized linear-phase response, $$\left(t_m - \frac{1}{M}\sum_{m=0}^{M-1} t_m\right).$$

In some embodiments, the timing mismatch between M ADC channels of the time-interleaved ADC 200 can be measured by applying a time varying signal to the time-interleaved ADC 200. In some instances, the time varying signal may be separately connected to each ADC channel by switching on the corresponding switch while switching off switches corresponding to other ADC channels of the time-interleaved ADC 200. A timing error of each ADC channel can then be measured. Based on the measured timing error, a feedback signal can be determined and applied to a clock phase generator (not shown) of the time-interleaved ADC 200. In some embodiments, the feedback signal is determined based at least upon individual time errors of all ADC channels of the time-interleaved ADC. The clock phase generator can adjust the clock signal according and reduce the timing error of each of the M ADC channels. In some embodiments, the clock phase generator can be a phase-lock loop (PPL) or a delay-locked loop (DLL).

In some embodiments, timing mismatches of the time-interleaved ADC 200 can be measured by incorporating an additional sampler (not shown) and a comparator (not shown) to the input end of each of the M ADC channels. Driven by the same clock phases as the main path, the sampler sense a periodic waveform provided by an on-chip oscillator (not shown). The on-chip oscillator provides an asynchronous clock. The comparator can be used to count inter-sample zero crossings. Since the additional sampling and comparison path in each of the M ADC channels operates independently of the main path, the timing mismatches can be measured in the background.

To compensate residue time mismatches of the time-interleaved ADC 200, an interleaving filter 250 can be incorporated to receive output signals of the gain correction 240 and coupled between the gain correction 240 and a digital output 255 of the time-interleaved ADC 200. The interleaving filter 250 can be configured to compensate residue time errors between the M ADC channels of the time-interleaved ADC 200. In some embodiments, the interleaving filter 250 is placed at the end of all other digital blocks of the time-interleaved ADC 200.

Figure 3:
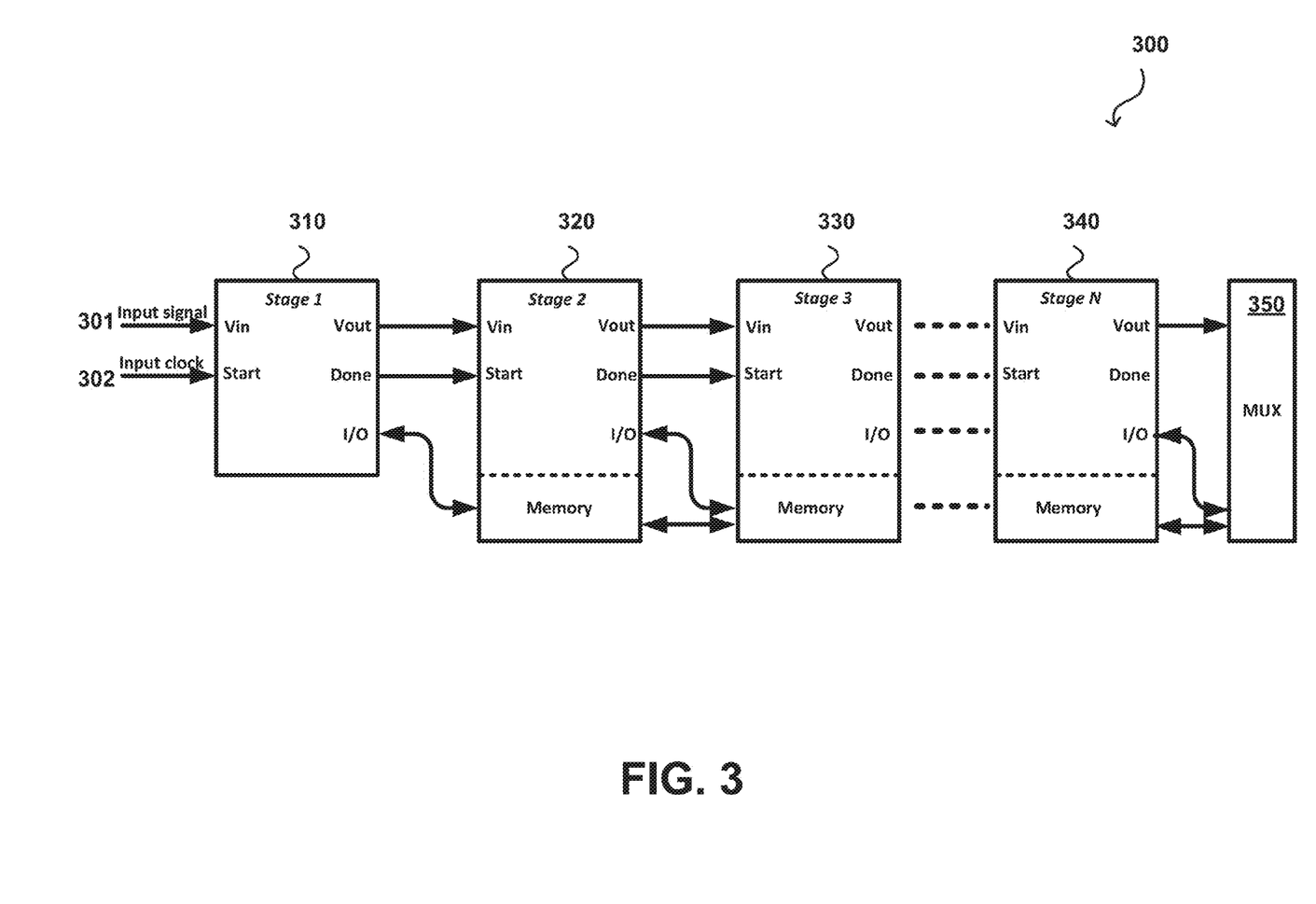
FIG. 3 illustrates an example of a pipeline ADC channel in a time-interleaved ADC in accordance with various embodiments.

FIG. 3 illustrates an example of an ADC channel in a time-leaved ADC, for example, a pipeline ADC channel 300, in accordance with various embodiments. The pipeline ADC channel 300 comprises a plurality of pipeline stages, a Stage1 310, Stage2 320, Stage3 330, and StageN 340. Although only four pipeline stages are shown in FIG. 3, it should be understood that the pipeline ADC may include various numbers of pipeline stages that capable of digitizing one or more bits of an input signal in accordance with various embodiments discussed herein. The Stage1 310 is coupled to an input signal 301 and an input clock 302. Each stage of the pipeline ADC channel 300 digitizes one or more bits of the input signal 301 and forwards the residue signal to the next stage for further digitization. In some embodiments, the StageN 340 is coupled to an MUX 350. In some embodiments, the StageN 340 is coupled to a flash ADC (not shown), which can be used for calibration of the pipeline ADC channel 300. A pipeline stage (e.g., pipeline stages 310, 320, 330 or 340) may also include an I/O interface to communicate with or receive feedback from a downstream pipeline stage or the flash ADC. In some instances, a pipeline stage may also include a memory to store one or more correction parameters of the pipeline stage.

In this example, stages in the plurality of stages in the pipeline ADC 300 can be self-timed and work asynchronously with respect to each other. For example, each of the plurality of stages, except the Stage1 310, waits for the previous stage to finish digitizing one or more bits of the input signal 301 and then starts to digitize the residue digits forwarded from the previous stage. The exemplary self-timing stages are advantageous over prior systems because only limited clock routing between stages are needed. Not only long global routing for the plurality of pipeline stages but also the memory I/O bits can be avoided.

In some embodiments, the pipeline ADC channel 300 may also include a sample-and-hold (S&H) circuit. The analog input to the pipeline ADC channel 300 is first sampled and held steady by the S&H before being quantized into one or more bits by the Stage1 310. The output with the one or more bits is then fed to a digital-to-analog converter (DAC). The analog output of the DAC is then subtracted from the analog input. The "residue" analog signal is amplified and provided to the next stage, Stage2 320. This amplified residue analog signal continues through the pipeline, providing one or more bits per stage until it reaches the pipeline StageN 340 or the flash ADC, which resolves one or more least significant bits (LSB). Because the bits from each stage are determined at different points in time, all the bits corresponding to the same sample signal can be time-aligned with shift registers. In some embodiments, the time-aligned signal can be fed to a digital-error-correction logic.

Figure 4:
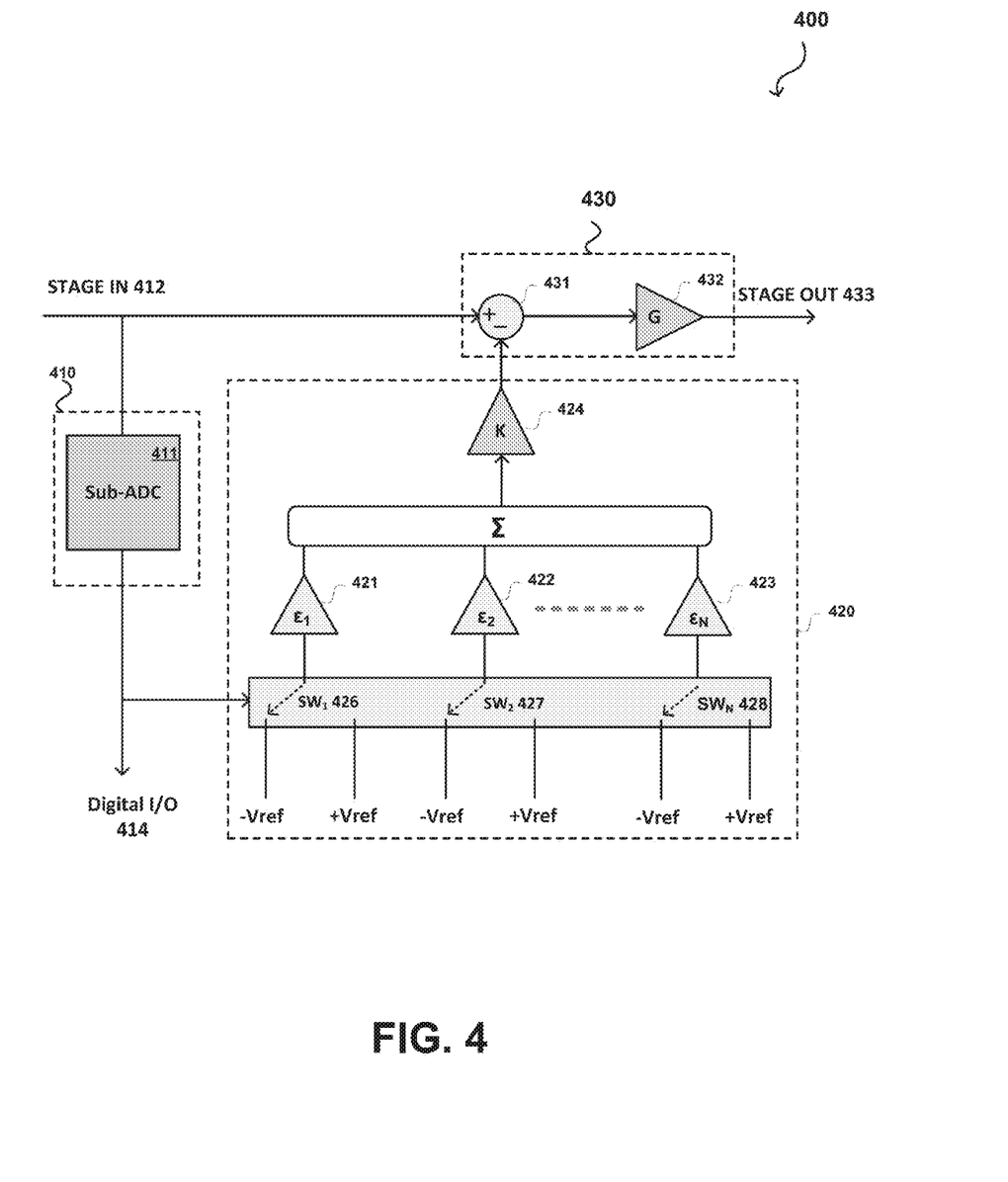
FIG. 4 illustrates an example stage in the pipeline ADC of FIG. 3 in accordance with various embodiments.

FIG. 4 illustrates an example stage 400 in the pipeline ADC of FIG. 3 in accordance with various embodiments. In this example, the stage 300 (e.g., the Stage2 320 of FIG. 3) comprises a number a sections. For example, as shown, the pipeline can include a first section 410, second section 420, and third section 430. The first section 410 is coupled to a stage-in signal 412 and includes a sub-ADC 411 that can extract a bit number, n; where n is the number of bits that the stage 400 will extract. An output signal of the sub-ADC 411 is coupled to a Digital I/O of the stage 400 and the second section 420. The second section 420 can be a digital-to-analog converter (DAC) that comprises a plurality of switches, $SW_1$ 426, $SW_2$ 427 $SW_N$ 428, and a reference voltage, $V_{ref}$. In some embodiments, the second section 420 is controlled by the output signal of the sub-ADC 411. An output signal of the second section 420 is coupled to the third section 430. The third section 430 includes an operational amplifier 432 that amplifies the difference between the stage-in signal 412 and the output signal of the second section 420. The difference can be subtracted by a subtraction circuit 431.

In some embodiments, the section three 430 further includes a sample-and-hold (S&H) circuit that is coupled between the stage-in signal 412 and the subtraction circuit 431. During normal operation, the S&H circuit and the sub-ADC 411 acquire the stage-in signal 412. The sub-ADC 411 converts the stage-in signal 412 to digital data. The conversion result forms the most significant bits of the digital output. The digital output signal is then fed into the DAC in the section two 420. The output signal of the section two 420 is subtracted from the stage-in signal 412. The residual analog signal is then amplified into a stage-out signal 433 and sent to the next stage in the pipeline to be sampled and converted as in the stage 400. In some embodiments, this process is repeated through suitable stages to achieve the desired resolution. For example, a pipeline DAC with p pipelined stages, each with an n-bit sub-ADC, can produce a high speed ADC with a resolution of m=p*n bits.

In some embodiments, the time aperture between the sampling of an S&H circuit and signal quantization in the sub-ADC 411 is minimized to avoid signal-dependent conversion errors. In some embodiments, in order to maximize the settling time of the section two 420 (e.g., to achieve a high conversion speed), the sub-ADC 411 is configured to provide its digital output 414 to the DAC in the section two 420 when the S&H circuit samples the stage-in signal 412 and enters the hold mode (e.g., in the next clock cycle).

In many instances, a stage in a pipeline ADC channel can have multiple imperfections that affect the overall characteristic of the stage. The imperfection may come from various sources (e.g., a finite open loop gain of the stage's amplifier(s), and geometric mismatch between devices during fabrication). For example, one type of imperfection may come from the imperfect gain of an operational amplifier, which results in a gain of G that is lower than that from an ideal stage. The lower the open-loop gain of the operational amplifier, the more the stage gain drops below an ideal value. In an uncalibrated ADC, this difference can result in spectrum non-linearity that limits the number of bits converted by the ADC. A second type of imperfection may come from variations of the reference voltage, $V_{ref}$. In FIG. 4, the non-ideal reference voltage is illustrated by an unknown gain, K 424. A third source of imperfection may come from mismatches between capacitors of the plurality of switches, $SW_1$ 426, $SW_2$ 427 ... $SW_N$ 428. The effect of the mismatches between switches is illustrated by placing separate gains, $\epsilon_1$ 421, $\epsilon_2$ 422, $\epsilon_N$ 423, in the path of the signal in the section two 420.

In some embodiments, the stage 400 has a plurality of imperfections, N+2. To calibrate the stage 400, each of the plurality of imperfections needs to be estimated and compensated for. In some instances, there are N independent parameters in the plurality of imperfections, N+2. Various embodiments extract these independent parameters to calibrate the stage 400.

Figure 5:
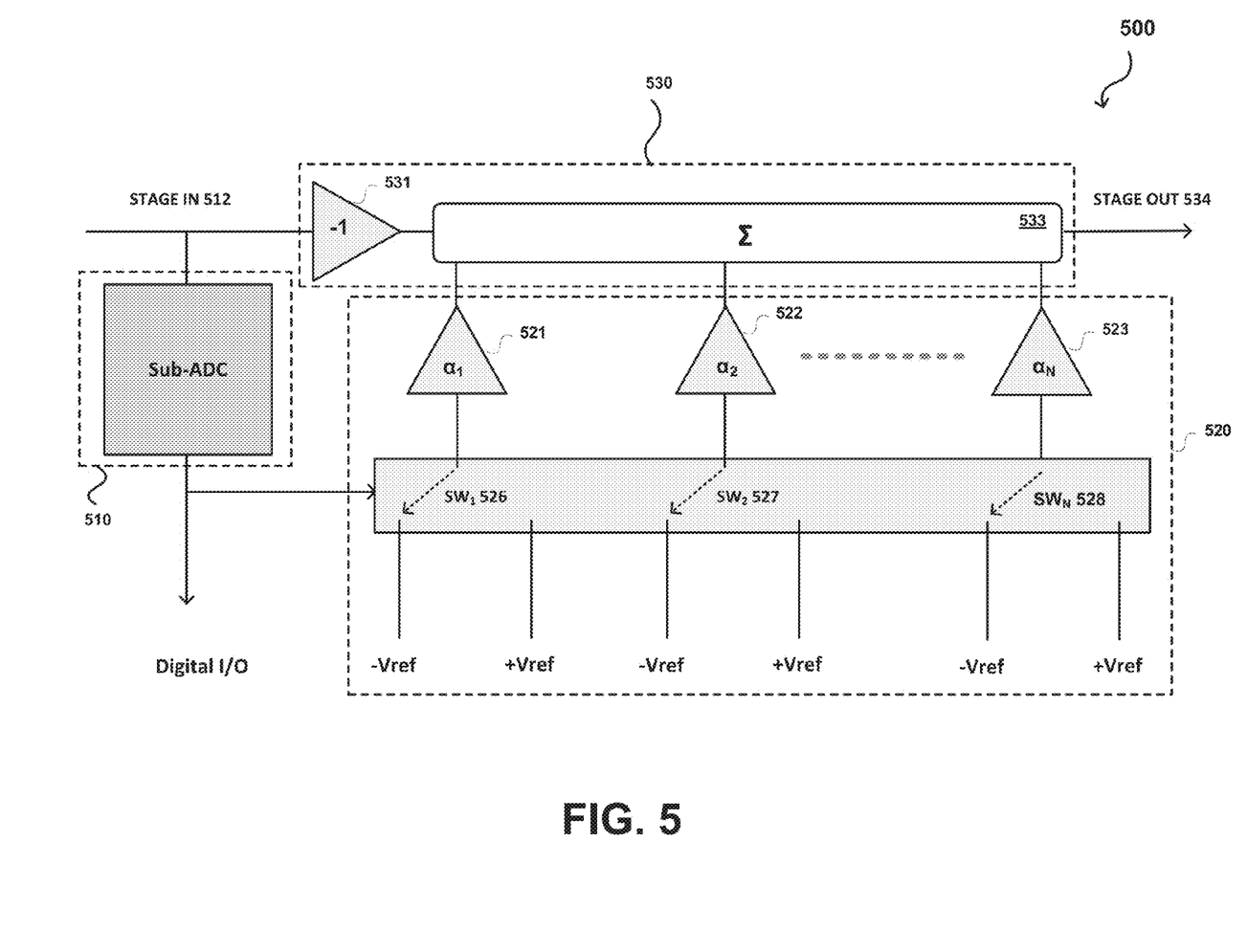
FIG. 5 illustrates a model of an exemplary stage in a pipeline ADC channel in accordance with various embodiments.

FIG. 5 illustrates a model of an exemplary stage 500 in a pipeline ADC channel in accordance with various embodiments. In this example, unknown independent parameters in the stage 500 are represented in a linear model. Various embodiments provide one or more calibration algorithms to extract these independent parameters in the stage 500. The stage 500 comprises three sections 510, 520 and 530. N independent parameters of the stage 500 can be extracted and applied as coefficients to an output signal of the stage 500 by a calibration process.

In some embodiments, the calibration process of a pipeline stage can start by connecting the input of the pipeline stage to a fixed voltage. The output of each pipeline stage can be altered by changing the position of N switches in the corresponding stage. For example, the stage-in signal 512 can be a fixed voltage. Two stage-out signals 534 can be recorded when the switch SW1 526 is connected to $-V_{ref}$ and when the switch SW1 426 is connected to $+V_{ref}$, respectively. The difference between these two stage-out signals is a known function of $\alpha_1$ 521, which is an unknown independent parameter of the stage 500. In some embodiments, different levels of reference voltages can be used in determining the $\alpha_1$ 521 (e.g., different reference voltage levels implemented by a resistor string). In some embodiments, to protect a reference node coupled to a reference voltage, the reference node can be connected to a large capacitor to reduce associated voltage errors and keep the reference stable.

In some embodiments, the calibration process of a pipeline stage can start by connecting the input of the pipeline stage to a fixed voltage. The output of each pipeline stage can be altered by changing the position of N switches in the corresponding stage. For example, the stage-in signal 512 can be a fixed voltage. Two stage-out signals 534 can be recorded when the switch SW1 526 is connected to $-V_{ref}$ and when the switch SW1 526 is connected to $+V_{ref}$, respectively. The difference between these two stage-out signals is a known function of $\alpha_1$ 521, which is an unknown independent parameter of the stage 500. In some embodiments, different levels of reference voltages can be used in determining the $\alpha_1$ 521 (e.g., different reference voltage levels implemented by a resistor string).

The same procedures can be repeated for the rest of switches $SW_2$ 527, $SW_N$ 528 to extract unknown independent parameters, $\alpha_2$ 522, $\alpha_N$ 523, respectively. Therefore, N unknown independent parameters in the stage 500 can be extracted by changing N switches in the stage 500. The imperfection represented by these N independent parameters can be represented by a sum 533 and compensated by a gain 531. By performing the calibration steps for all the remaining stages in a pipeline ADC channel, all N independent parameters in each pipeline stage can be extracted and calibrated. The extracted parameters can be stored and applied as coefficients to an output signal of each pipeline stage during normal operations. In some embodiments, the calibration process of a pipeline ADC channel can start from the last stage and then proceed to the upstream pipeline stages.

In some embodiments, a digital calibration of a pipeline ADC channel can comprise two sections, estimation and correction. The estimation section can be performed during a start-up of the pipeline ADC channel according to one or more calibration algorithms. For example, the one or more calibration algorithms can start from the last pipeline stage and apply a known input signal to that stage. In some embodiments, the last pipe line stage is connected to a flash ADC. In some instances, the flash ADC can contain many digital decoding functions and be integrated in the same integrated circuit (IC) or connected as a discrete circuit component. The combination of the digital output of the last pipeline stage and the flash ADC can be used to calculate and store independent parameters and/or their corresponding calibration coefficients of the last pipeline stage. When the last pipeline stage is calibrated, the one or more calibration algorithms can move to the upstream pipeline stage and perform the same calibration process. In this upstream pipeline stage, the combination of the flash ADC and downstream pipeline stages can be used for calibrating this stage. Utilizing all downstream pipeline stages can be important since calibration accuracy needs to be more accurate for upstream pipeline stages. The one or more calibration algorithms can continue with all the remaining pipeline stages by applying a known input signal and extracting independent parameters of each of these pipeline stages. The corresponding calibration coefficients of each pipeline stage can be calculated and stored.

The correction section can be a back-end digital block that calculates the corrected digital output based at least upon the calculated coefficients of each pipeline stage of the pipeline ADC channel. In some embodiments, the digital block of the correction section is composed of a series of adders and shift registers and does not require any multiplier. For example, the calculated digital output of a pipeline ADC channel is a bit-wise product between the coefficients of each pipeline stage and individual output of the corresponding stage. Thus, the output is in effect of multiplying the coefficients by 0 or 1, which can be essentially a multiplexer. The output of these multiplexes can be added to generate a corrected output signal. In this example, the digital block of the correction section can run much faster than a typical correction section because the correction does not require any multiplications.

Figure 6:
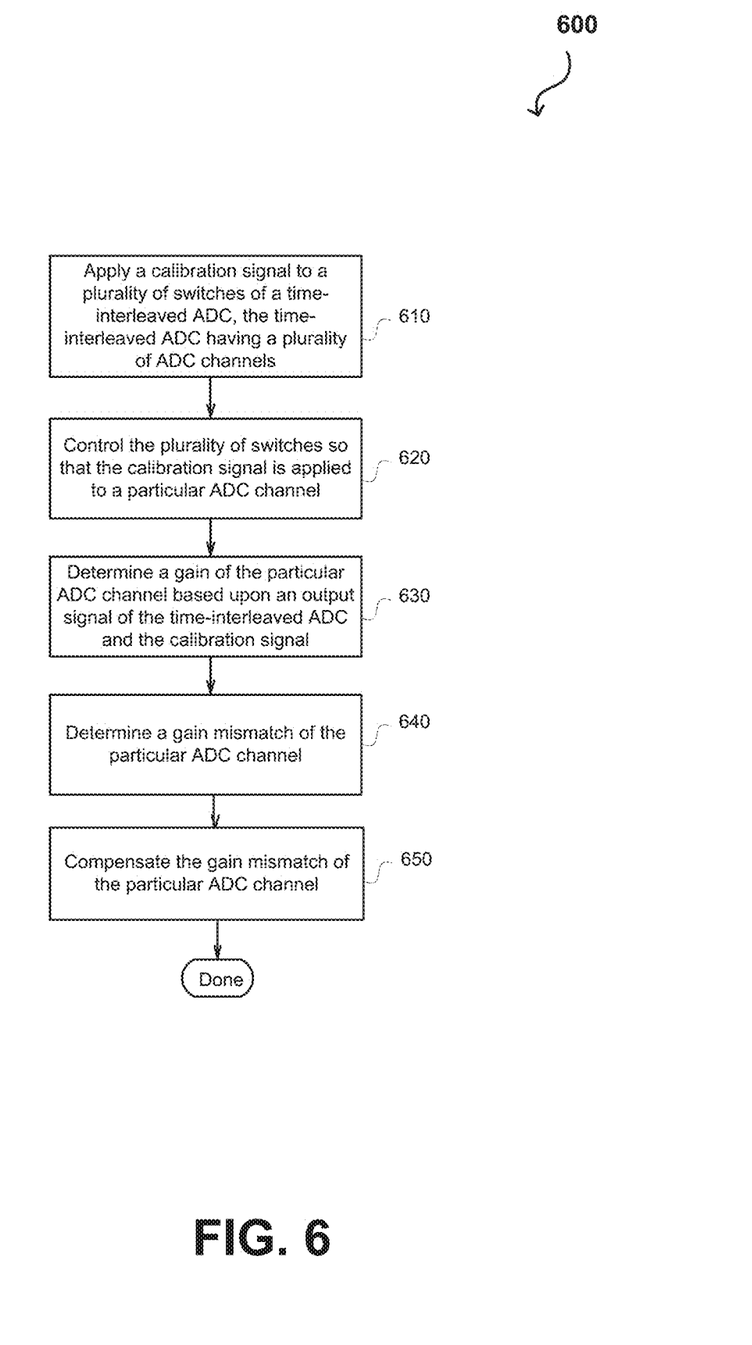
FIG. 6 illustrates an example process of calibrating a gain mismatch of a time-interleaved ADC in accordance with various embodiments.

FIG. 6 illustrates an example process 600 of calibrating a gain mismatch of a time-interleaved ADC in accordance with various embodiments. It should be understood that there can be additional, fewer, or alternative steps performed in similar or alternative orders, or in parallel, within the scope of the various embodiments unless otherwise stated. The example method embodiment 600 starts with applying a calibration signal (e.g., a DC signal) to a plurality of switches of the time-interleaved ADC, at step 610. The time-interleaved ADC may include a plurality of ADC channels. Each of the plurality of switches is connected to a corresponding ADC channel. In some embodiments, the ADC channels can be flash ADC channels or pipeline ADC channels.

The plurality of switches can be controlled such that the calibration signal is applied to a particular ADC channel and disconnected to the other ADC channels of the time-interleaved ADC, at step 620. A gain of the particular ADC channel can be determined based upon an output signal of the particular ADC channel and the calibration signal, at step 630. The calibration signal can be independently applied to the remaining ADC channels of the time-interleaved ADC. A gain mismatch of the particular ADC channel can be determined based at least upon the gain of the particular ADC channel or the determined gains of the plurality of ADC channels, at step 640. The gain mismatch can be compensated by a gain correct circuit that is coupled to a digital output of the particular ADC channel, at step 650. In some embodiments, the gain mismatch of the particular ADC channel can be compensated by adding one or more adders and one or more multipliers to a digital signal path of the particular ADC channel.

In some embodiments, a gain mismatch of a particular ADC channel is estimated by an estimation circuit. The estimation circuit may be coupled to a calibration signal, a plurality of switches of the time-interleaved ADC, a plurality of ADC channels of the time-interleaved ADC, and the gain correct circuit. In some embodiments, the estimation circuit is configured to select at least one of a calibration signal or an input signal to connect to an input end of the time-interleaved ADC, and control at least one of the plurality of switches, the plurality of ADC channels, or the gain correction circuit.

In some embodiments, the time-interleaved ADC may include multiple pipeline ADC channels. Each pipeline ADC channel may comprises a plurality of pipeline stages. A particular pipeline stage may comprise a first section, a second section and a third section. The first section includes a sub-ADC configured to extract one or more bits from an analog input signal of the particular pipeline stage. The second section comprises a digital-to-analog (DAC) including multiple switches. The third section comprises an operational amplifier configured to amplify a residue signal of the analog input signal of the particular pipeline stage subtracting the DAC's output signal.

In some embodiments, an output signal of the particular pipeline ADC channel can be corrected by applying a correction coefficient of each of the plurality of pipeline stages to the corresponding pipeline stage. A correction coefficient of each of the plurality of pipeline stages can be estimated by a process comprising: applying a known input signal to a last pipeline stage of the particular pipeline channel, adjusting one or more settings of the last pipeline stage, estimating one or more correction parameters of the last pipeline stage, calculating a correction coefficient for the last pipeline stage based at least upon the estimated one or more correction parameters of the last pipeline stage, estimating one or more correction parameters of each of remaining pipeline stage(s) in the particular pipeline ADC channel, and calculating the correction coefficient of each of the remaining pipeline stage(s) based at least upon one or more correction parameters of the corresponding pipeline stage.

Figure 7:
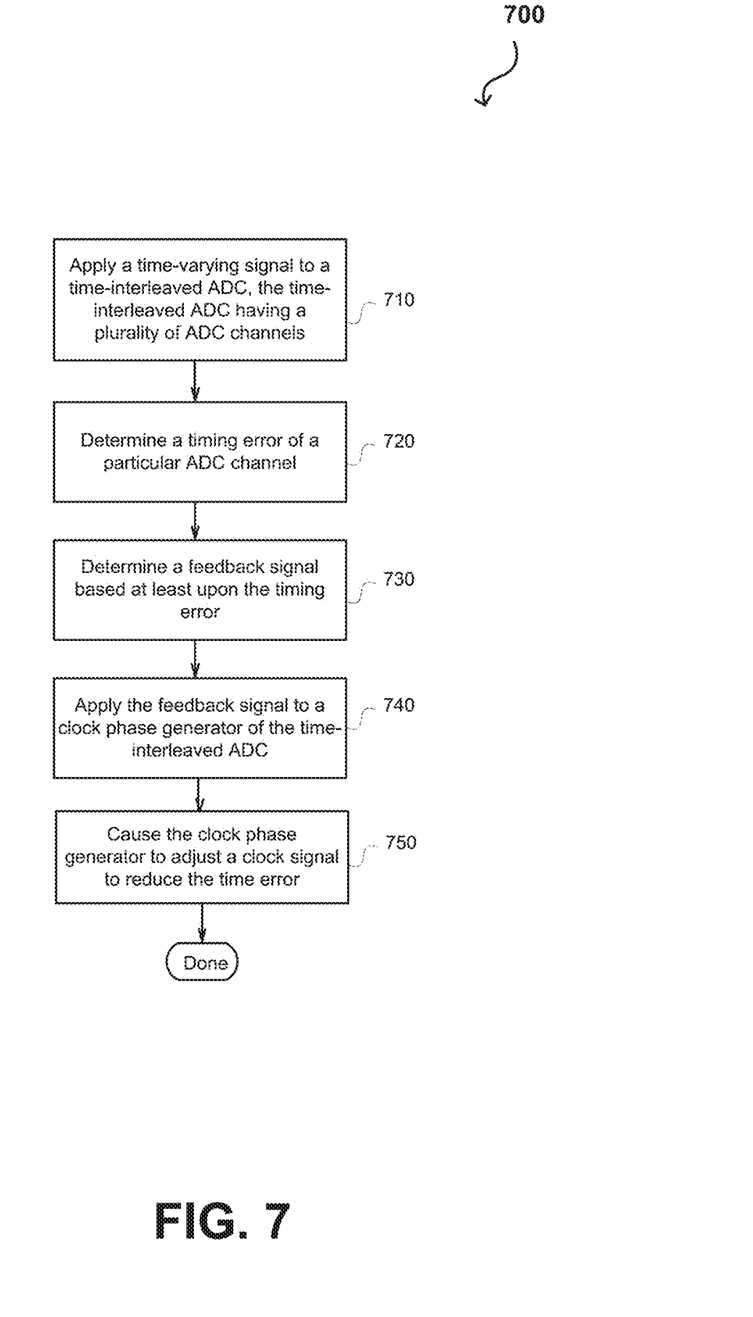
FIG. 7 illustrates an example process of calibrating one or more time mismatches in a time-interleaved ADC in accordance with various embodiments.

FIG. 7 illustrates an example process 700 of calibrating one or more time mismatches in a time-interleaved ADC in accordance with various embodiments. It should be understood that there can be additional, fewer, or alternative steps performed in similar or alternative orders, or in parallel, within the scope of the various embodiments unless otherwise stated. The example method embodiment 700 starts with applying a time-varying signal to a time-interleaved ADC, at step 710. The time-interleaved ADC includes a plurality of ADC channels. In some embodiments, the time-varying signal is coupled to a plurality of switches, each of which is connected to a corresponding ADC channel. The ADC channels can be either flash ADC channels or pipeline ADC channels.

One or more timing mismatches between the plurality of ADC channels can be determined, at step 720. In some embodiments, the time-varying signal can be applied to a particular ADC channel while the signal is disconnected from the other ADC channels of the time-interleaved ADC. A timing error of the particular ADC channel can be measured. A feedback signal can be determined based at least upon the timing error of the particular ADC channel, at step 730. In some embodiments, a feedback signal is determined based upon timing errors of the plurality of ADC channels in the time-interleaved ADC. The feedback signal can be applied to a clock phase generator of the time-interleaved ADC, at 740. The clock phase generator can adjust a clock signal of the time-interleaved ADC to reduce the time error of the particular ADC channel or the time errors of the time-interleaved ADC, at step 750. In some embodiments, the clock phase generator includes at least one of a phase lock loop or a delay-locked loop. In some embodiments, residual time errors of the time-interleaved ADC can be compensated by an interleaving filter that is coupled to digital outputs of the plurality of ADC channels.

Various embodiments of the present disclosure provide methods for a gain mismatch and/or time error in a time-interleaved ADC. While specific examples have been cited above showing how the optional operation may be employed in different instructions, other embodiments may incorporate the optional operation into different instructions. For clarity of explanation, in some instances the present disclosure may be presented as including individual functional blocks including functional blocks comprising devices, device components, steps or routines in a method embodied in software, or combinations of hardware and software.

The various embodiments can be further implemented in a wide variety of operating environments, which in some cases can include one or more computing devices which can be used to operate any of a number of applications. The one or more processors or computing devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent embodiments, or portions thereof, are implemented in hardware, the present invention may be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most embodiments utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The wideband receiver can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The foregoing description of embodiments of the present invention has been provided for the purposes of illustration and description. It is not intended to be exhaustive or to limit the invention to the precise forms disclosed. Many modifications and variations will be apparent to one of ordinary skill in the relevant arts. For example, steps preformed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular used contemplated. It is intended that the scope of the invention be defined by the claims and their equivalents.

What is claimed is:

1. A method, comprising:
    applying a calibration signal to a first plurality of switches in a time-interleaved analog-to-digital converter (ADC), the time-interleaved ADC comprising a plurality of ADC channels;
    controlling the first plurality of switches to apply the calibration signal to a particular ADC channel of the plurality of ADC channels;
    controlling the first plurality of switches to disconnect the calibration signal from other ADC channels of the plurality of ADC channels;
    determining a gain of the particular ADC channel based at least upon an output signal of the particular ADC channel and the calibration signal;
    estimating a gain mismatch of the particular ADC channel; and
    compensating the gain mismatch of the particular ADC channel.

2. The method of claim 1, further comprising:
    determining gains of the other ADC channels of the plurality of ADC channels; and
    estimating the gain mismatch of the particular ADC channel based at least upon the gain of the particular ADC channel and the determined gains of the other ADC channels.

3. The method of claim 1, wherein the gain mismatch of the particular ADC channel is compensated by coupling the output signal of the particular ADC channel to a gain correction circuit.

4. The method of claim 3, wherein the gain mismatch is estimated by an estimation circuit that is configured to determine the gain mismatch of the particular ADC channel.

5. The method of claim 4, wherein the estimation circuit is coupled to the calibration signal, the first plurality of switches, the plurality of ADC channels, and the gain correction circuit.

6. The method of claim 5, wherein the estimation circuit is configured to
    select at least one of the calibration signal or an input signal;

connect the at least one of the calibration signal or the input signal to an input end of the time-interleaved ADC; and control at least one of the first plurality of switches, the plurality of ADC channels, or the gain correction circuit.

7. The method of claim 1, wherein the calibration signal is a DC signal.

8. The method of claim 1, wherein the plurality of ADC channels are a plurality of pipeline ADC channels.

9. The method of claim 8, further comprising:
applying a known input signal to a last pipeline stage of a particular pipeline ADC channel, the particular pipeline ADC channel comprising a plurality of pipeline stages;
adjusting one or more settings of the last pipeline stage;
estimating one or more correction parameters of the last pipeline stage;
calculating a correction coefficient for the last pipeline stage based at least in part upon the estimated one or more correction parameters of the last pipeline stage;
estimating one or more correction parameters of each of remaining pipeline stage(s) in the particular pipeline ADC channel;
calculating a correction coefficient of each of the remaining pipeline stage(s) based at least upon the estimated one or more correction parameters of the corresponding pipeline stage; and
correcting an output signal of the particular pipeline ADC channel by applying the correction coefficient of each of the plurality of pipeline stages to the corresponding pipeline stage.

10. The method of claim 9, wherein each of the plurality of pipeline stages comprises a first section, a second section and a third section, the first section including a sub-ADC configured to extract one or more bits from an analog input signal of the corresponding pipeline stage, the second section comprising a digital-to-analog converter (DAC) including a second plurality of switches, the third section comprising an operational amplifier configured to amplify a residue signal of the analog input signal of the corresponding pipeline stage subtracting the DAC's output signal.

11. A method, comprising:
applying a time-varying signal to a time-interleaved analog-to-digital converter (ADC), the time-interleaved ADC comprising a plurality of ADC channels;
determining a timing error of a particular ADC channel;
determining a feedback signal based at least upon the timing error of the particular ADC channel;
applying the feedback signal to a clock phase generator of the time-interleaved ADC, the clock phase generator configured to generate one or more clock signals for the timeinterleaved ADC; and
causing the clock phase generator to adjust the one or more clock signals to reduce the time error based at least upon the feedback signal.

12. The method of claim 11, wherein the time error of the particular ADC channel is determined by applying the time-varying signal to the particular ADC channel while other ADC channels of the plurality of ADC channels of the time-interleave ADC are disconnected from the time-varying signal.

13. The method of claim 11, wherein the clock phase generator includes at least one of a phase lock loop or a delay-locked loop.

14. The method of claim 11, wherein the time error of the particular ADC channel is determined based upon inter-sample zero crossings by incorporating an additional sampler and a comparator to an input end of the particular ADC channel, the additional sampler driven by the one or more clock signals of the time-interleaved ADC and configured to sense a periodic waveform provided by an on-chip oscillator, the comparator configured to count the inter-sample zero crossings.

15. The method of claim 11, wherein the plurality of ADC channels are a plurality of pipeline ADC channels.

16. The method of claim 15, further comprising:
applying a known input signal to a last pipeline stage of a particular pipeline ADC channel, the particular pipeline ADC channel comprising a plurality of pipeline stages;
adjusting one or more settings of the last pipeline stage;
estimating one or more correction parameters of the last pipeline stage;
calculating a correction coefficient for the last pipeline stage based at least in part upon the estimated one or more correction parameters of the last pipeline stage;
estimating one or more correction parameters of each of remaining pipeline stage(s) in the particular pipeline ADC channel;
calculating a correction coefficient of each of the remaining pipeline stage(s) based at least upon the estimated one or more correction parameters of the corresponding pipeline stage; and
correcting an output signal of the particular pipeline ADC channel by applying the correction coefficient of each of the plurality of pipeline stages to the corresponding pipeline stage.

17. The method of claim 16, wherein each of the plurality of pipeline stages comprises a first section, second section and third section, the first section including a sub-ADC configured to extract one or more bits from an analog input signal of the corresponding pipeline stage, the second section comprising a digital-to-analog converter (DAC) including a second plurality of switches, the third section comprising an operational amplifier configured to amplify a residue signal of the analog input signal of the corresponding pipeline stage subtracting the DAC's output signal.

18. The method of claim 17, further comprising:
applying the known input signal to a particular stage of the plurality of pipeline stages;
connecting one of the plurality of the switches in the second section of the particular stage to a reference voltage;
connecting the one of the plurality of the switches in the second section of the particular stage to a different reference voltage; and
estimating one of the one or more correction parameters of the corresponding pipeline stage based at least upon the known input signal, a difference in the particular stage's output signals under the reference voltage and the different reference voltage, or output signal(s) of the particular stage's downstream stage(s) in the pipeline ADC.

19. A receiver, comprising:
at least one processor; and
a non-transitory computer-readable medium including instructions that, when executed by the at least one processor, enable the receiver to:
apply a calibration signal to a first plurality of switches in a time-interleaved analog-to-digital converter (ADC), the time-interleaved ADC comprising a plurality of ADC channels;
control the first plurality of switches to apply the calibration signal to a particular ADC channel of the plurality of ADC channels;
control the first plurality of switches to disconnect the calibration signal from other ADC channels of the plurality of ADC channels;

determine a gain of the particular ADC channel based at least upon an output signal of the particular ADC channel and the calibration signal;
estimate a gain mismatch of the particular ADC channel; and
compensate the gain mismatch of the particular ADC channel.

20. The receiver of claim 19, wherein the instructions when executed further cause the receiver to:
determine gains of the other ADC channels of the plurality of ADC channels; and
estimate the gain mismatch of the particular ADC channel based at least upon the gain of the particular ADC channel and the determined gains of the other ADC channels.

* * * * *